US012627135B2

(12) United States Patent
Naidu et al.

(10) Patent No.: US 12,627,135 B2
(45) Date of Patent: May 12, 2026

(54) DISTANCE PROTECTION OF A TRANSMISSION LINE

(71) Applicant: Hitachi Energy Ltd, Zürich (CH)

(72) Inventors: Od Naidu, Bangalore (IN); Neethu George, Bangalore (IN); Sinisa Zubic, Västerås (SE); Zoran Gajic, Västerås (SE)

(73) Assignee: HITACHI ENERGY LTD, Zürich (CH)

( * ) Notice: Subject to any disclaimer, the term of this patent is extended or adjusted under 35 U.S.C. 154(b) by 226 days.

(21) Appl. No.: 18/702,199

(22) PCT Filed: Nov. 4, 2022

(86) PCT No.: PCT/EP2022/080859
§ 371 (c)(1),
(2) Date: Apr. 17, 2024

(87) PCT Pub. No.: WO2023/079100
PCT Pub. Date: May 11, 2023

(65) Prior Publication Data
US 2025/0038519 A1 Jan. 30, 2025

(30) Foreign Application Priority Data

Nov. 5, 2021 (IN) .............................. 202141050738
Dec. 23, 2021 (EP) ..................................... 21217593

(51) Int. Cl.
*H02H 3/40* (2006.01)
*G01R 31/08* (2020.01)
(Continued)

(52) U.S. Cl.
CPC ........... *H02H 3/405* (2013.01); *G01R 31/085* (2013.01); *G01R 31/52* (2020.01); *H02H 7/26* (2013.01)

(58) Field of Classification Search
CPC ...... G01R 31/085; G01R 31/52; H02H 3/405; H02H 7/26; H02H 7/28
(Continued)

(56) References Cited

U.S. PATENT DOCUMENTS 2,584,765 A * 2/1952 Warrington .......... H02H 1/0046
361/80
5,428,549 A * 6/1995 Chen .................... G01R 31/088
361/88
(Continued)

FOREIGN PATENT DOCUMENTS

JP H0572251 A 3/1993
JP 2006505768 A 2/2006
JP 2023541318 A 9/2023

OTHER PUBLICATIONS

Banaiemoqadam et al., "A Control-Based Solution for Distance Protection of Lines Connected to Converter-Interfaced Sources During Asymmetrical Faults." IEEE Transactions on Power Delivery, vol. 35, No. 3, pp. 1455-1466, Jun. 2020.
(Continued)

*Primary Examiner* — Kevin J Comber
(74) *Attorney, Agent, or Firm* — PROCOPIO, CORY, HARGREAVES & SAVITCH LLP

(57) ABSTRACT
The present disclosure relates to a method for distance protection of a transmission line carrying a plurality of phases for a phase-to-phase-to-ground fault comprising a first phase and a second phase of the plurality of phases as faulted phases in the phase-to-phase-to-ground fault, wherein the first phase is different from the second phase, the method comprising: obtaining a first impedance of a first electrical loop formed by a first phase carried on the transmission line and a ground potential based on a zero-sequence current (S601); obtaining a second impedance of a second electrical loop formed by a second phase carried on
(Continued)

220 kV, 50 Hz system the transmission line and a ground potential based on the zero-sequence current (S602); computing an apparent impedance of the transmission line and a ground potential based on the transmission line seen at a first terminal based on the first impedance and the second impedance (S603); and performing the distance protection based on the apparent impedance (S604). The present disclosure also relates to a respective device, computer-readable medium, and system.

20 Claims, 11 Drawing Sheets

(51) Int. Cl.
  *G01R 31/52* (2020.01)
  *H02H 7/26* (2006.01)
(58) Field of Classification Search
  USPC .......................................................... 361/80
  See application file for complete search history.

(56) References Cited

U.S. PATENT DOCUMENTS

| | | | | |
|---|---|---|---|---|
| 6,034,592 | A | 3/2000 | Jurisch et al. | |
| 2002/0053912 | A1* | 5/2002 | Saha .................... | G01R 31/088 |
| | | | | 324/525 |
| 2009/0021878 | A1* | 1/2009 | Saha ...................... | G01R 31/52 |
| | | | | 361/81 |

OTHER PUBLICATIONS

Barzegar-Bafrooei et al., "Studying a novel method for mitigation of the adverse impacts of SFCL on transmission line distance protection", IET Generation, Transmission & Distribution, IET, UK, vol. 13, issue. 17, pp. 3823-3835, Aug. 9, 2019.

IEA, "Global Energy Review 2020, The impacts of the Covid-19 crisis on global energy demand and CO2 emissions", International Energy Agency, 55 pages.

Ma et al., "Protection collaborative fault control for power electronic-based power plants during unbalanced grid faults", International Journal of Electrical Power & Energy Systems, Jordan Hill, Oxford, GB, vol. 130, Mar. 30, 2021.

Mishra et al., "Adaptive Distance Relaying for Distribution Lines Connecting Inverter-Interfaced Solar PV Plant", IEEE Transactions on Industrial Electronics, IEEE Service Center, Piscataway, NJ, USA, vol. 68, No. 3, Mar. 2021, pp. 2300-2309.

Raju et al., "Adaptive Logic for Distance Protection of Feeder Connecting Renewable Energy", 2021 Innovations in Energy Management and Renewable Resources (52042), IEEE, Feb. 5, 2021, 6 pages.

Paladhi et al., "Adaptive Distance Protection for Lines Connecting Converter-Intrefaced Renewable Plants" in IEEE Journal of emerging and selected topics in power electronics, vol. 30, No. 4, 10 pages.

Pradhan et al., "Distance Protection of Inverter Based Renewables Power Evacuating Lines and Downstream Network: Issues and Mitigation Approach", 2022 IEEE PES Innovative Smart Grid Technologies—Asia (ISGT Asia), Nov. 1, 2022, DOI: 10.1109/ISGTAsia54193.2022.10003580, 5 pages.

Author Unknown, "Double Line to Ground Fault Waveform", Voltage Disturbance, Nov. 20, 2019 https://web.archive.org/web/20200808182032/https://voltage-disturbance.com/power-engineering/double-line-to-ground-fault-waveform/, 6 pages.

Paladhi et al., "Adaptive Distance Protection for Lines Connecting Converter-Interfaced Renewable Plants" , IEEE Journal of Emerging and Selected Topics in Power Electronics, Jun. 5, 2020 , vol. 9, No. 6 , pp. 7088-7098 , DOI: 10.1109/JESTPE.2020.3000276.

Alexander et al., "Ground Distance Relaying: Problems and Principles", Nineteenth Annual Western Protective Relay Conference, Oct. 20, 1991, 38 pages.

\* cited by examiner

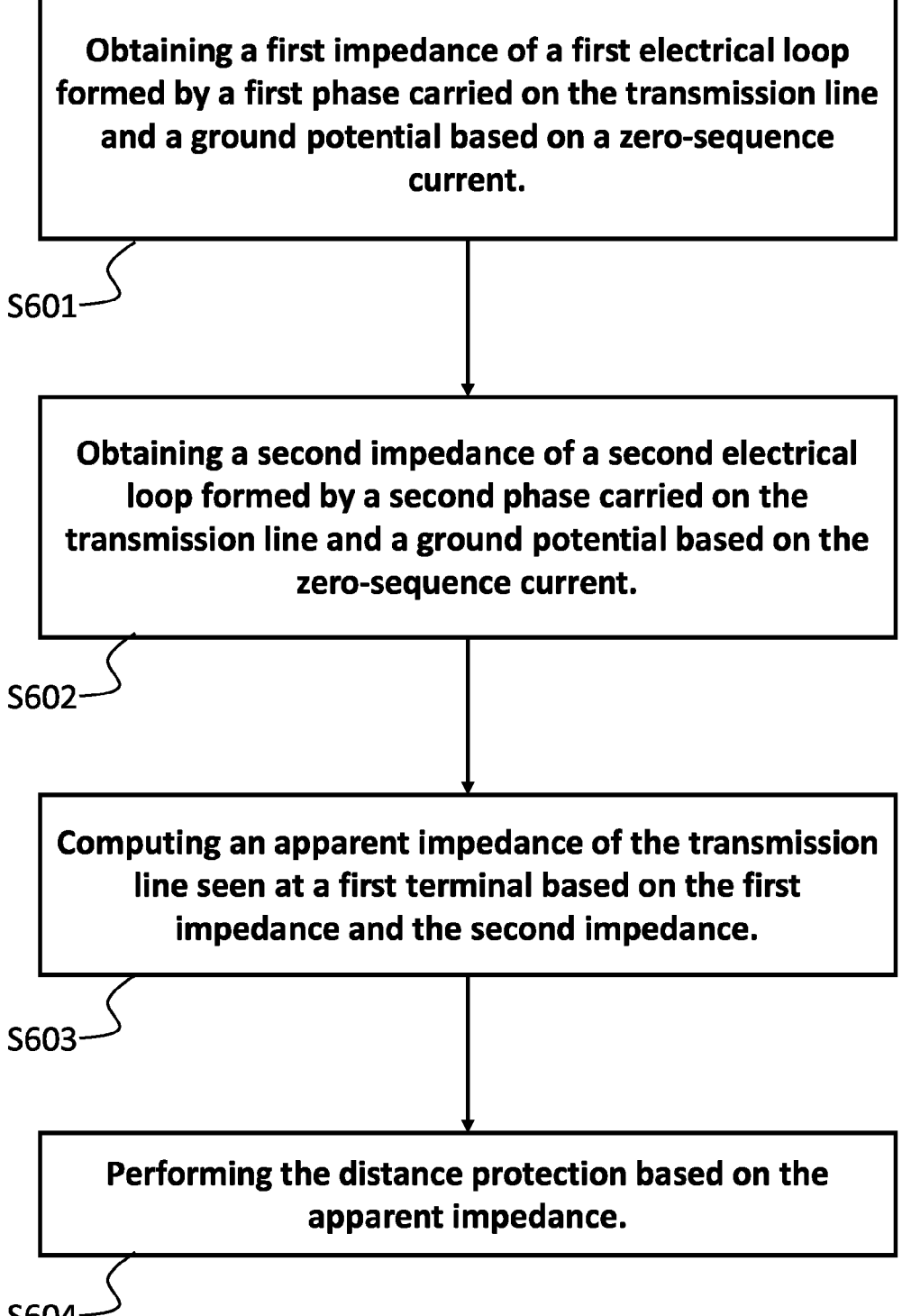

Obtaining a first impedance of a first electrical loop formed by a first phase carried on the transmission line and a ground potential based on a zero-sequence current.

S601

Obtaining a second impedance of a second electrical loop formed by a second phase carried on the transmission line and a ground potential based on the zero-sequence current.

S602

Computing an apparent impedance of the transmission line seen at a first terminal based on the first impedance and the second impedance.

S603

Performing the distance protection based on the apparent impedance.

| Fault Resistance | Actual fault impedance | Apparent impedance | |
|---|---|---|---|
| | | 1$^{st}$ method | 2$^{nd}$ method |
| 0Ω | 2.14 +30.46i | 3.89 + 31.44i | 1.11 + 30.675i |
| 10Ω | 2.14 +30.46i | 50.572 - 20.97i | 19.116 + 33.17i |
| 20Ω | 2.14 +30.46i | 114.4 - 34.26i | 37.14 + 36.29i |

| Pre-fault load current | Actual fault impedance | Apparent impedance | |
| --- | --- | --- | --- |
| | | $1^{st}$ method | $2^{nd}$ method |
| 50A | 1.78 +25.39$i$ | 955.8 - 451.7$i$ | 23.92 +31.11$i$ |
| 370A | 1.78 +25.39$i$ | 193.48 -74.97$i$ | 27.70 +32.30$i$ |
| 750A | 1.78 +25.39$i$ | 99.48 -26.97$i$ | 30.55 +30.99$i$ |
| 1500A | 1.78 +25.39$i$ | 52.49 - 3.53$i$ | 30.50 +25.23$i$ |

1110

1100

DISTANCE PROTECTION OF A TRANSMISSION LINE

CROSS-REFERENCE TO RELATED APPLICATIONS

The present application is a national stage entry of International Patent Application No. PCT/EP2022/080859, filed on Nov. 4, 2022, which claims priority to Indian patent application Ser. No. 202141050738, filed on Nov. 5, 2021, and European Patent Application No. 21217593.9, filed on Dec. 23, 2021, which are all hereby incorporated herein by reference as if set forth in full.

The present disclosure relates to a method, a device, a computer-readable medium, and a system for performing a distance protection of a transmission line connecting generators.

An electrical grid comprising generators, in particular distributed generators, connected with transmission lines requires a stringent fault-ride through condition to prevent further propagation of faults through the grid network, thereby ensuring a reliable power supply even in the presence of grid faults. Many systems implement relays along the transmission lines and control, in case of faults detections, the relays to achieve an electrical isolation of the faulted lines. Particularly, a distance protection principle determines the fault location with respect to the location of a relay by calculating the electrical characteristics, in particular an apparent impedance seen from the relay. The relays in the grid are controlled based on the computed fault locations.

Traditional synchronous generators exhibit different electrical characteristics in comparison to the distributed energy resources (DERs), particularly asynchronous generators. The frequency of a generated electricity therefrom differs from the operating frequency of the grid, thus must be synchronized through inverters. Hence, such generators are otherwise referred to as inverter-based resources (IBRs), including a photo-voltaic generator and a wind turbine generator. In an existing line protection, in particular distance protection, the fault locations are computed based on the electrical characteristics of synchronous generators, thus results in a significant error when asynchronous generators are considered.

The following presents a system comprising two synchronous generators and a system comprising a synchronous generator and an asynchronous generator. Furthermore, the apparent impedance calculation methods and their performances are presented with the accompanying figures.

FIG. 1a) and b) illustrate schematics of a two-terminal transmission line system connected to generators. FIG. 1a) illustrates a schematic of two-terminal transmission line system connecting two synchronous generators. The two-terminal transmission line system 100 operating at 220 kV and 50 Hz comprises the first synchronous generator 101 connected to the second synchronous generator 102 with the transmission line 110. The transmission line 110 is terminated by a BUS N (equivalently, terminal N or remote terminal) 111 on one side towards the first synchronous generator 101 and by a BUS M (equivalently, terminal M or local terminal) 112 on the other side towards the second synchronous generator 102. The distance between the terminal N 111 and the terminal M 112 is 100 km in this example. The terminal M 112 comprises a relay, in particular a distance relay to be controlled by a distance protection control method. The voltmeter 122 monitors voltage at the terminal M 112 and feeds the measured values to the intelligent electronic device (IED) 121. The current meter 123 measures the current at the terminal M 112 and feeds the measured values to the IED 121. The IED 121 is configured to perform any required computing for the distance protection method. The fault 131 is located on any point on the transmission line 110 between the distance covered by the terminal M 112 and the terminal N 111.

FIG. 1b) illustrates a schematic of a two-terminal transmission line system connecting one synchronous generator and one asynchronous generator through a delta-wye, $\Delta$–Y, transformer and a wye-delta, Y–$\Delta$, transformer. The $\Delta$–Y transformer allows a single-phase load to be distributed among the three phases to neutral and vice-versa for the Y–$\Delta$ transformer. The two-terminal transmission line system 150 operating at 220 kV and 50 Hz comprises the first synchronous generator 151 connected to the second asynchronous generator (a plurality of wind turbines) 154 through the Y–$\Delta$ transformer 153 and the $\Delta$–Y transformer 152, with transmission line 160. In this example, the rated active power of each wind turbine is 2 MW and 100 wind turbines are considered. The transmission line 160 is terminated by the BUS N (equivalently, terminal N or remote terminal) 161 on one side towards the first synchronous generator 151 and by the BUS M (equivalently, terminal M or local terminal) 162 on the other side towards the second asynchronous generator 162. The distance between the terminal N 251 and the terminal M 152 is exemplarily 100 km. The terminal M 152 comprises a relay, in particular a distance relay to be controlled by the distance protection control method. The voltmeter 172 monitors the voltage at the terminal M 162 and feeds the measured values to the IED 171. The current meter 173 measures the current at the terminal M 162 and feeds the measured values to the IED 171. The IED 171 is configured to perform any required computing for the distance protection method of the present disclosure. The fault 181 is located on any point on the transmission line 160 between the distance covered by the terminal M 162 and the terminal N 161.

FIG. 2 illustrates an equivalent circuit diagram of phase B-to-phase C-to ground (BC-g) fault in a transmission line system, in particular the system as disclosed in FIG. 1a) and b). The transmission line comprises the first line 210 carrying a first phase (phase A), the second line 220 carrying a second phase (phase B), and the third line 230 carrying a third phase (phase C). The voltage phasors corresponding to the phases A, B, and C measured at the terminals M 112 and 162 are denoted as $V_{AM}$, $V_{BM}$, and $V_{CM}$, respectively. Similarly, the voltage phasors corresponding to the phases A, B and C measured at the terminals N 111 and 161 are denoted as $V_{AN}$, $V_{BN}$, and $V_{CN}$, respectively. The current phasors corresponding to the phase B and C measured at the terminals M 112 and 162 are denoted as $I_{BM}$ and $I_{CM}$, respectively. Similarly, the current phasors corresponding to the phase B and C measured at the terminal N 111 and 161 are denoted as $I_{BN}$ and $I_{CN}$, respectively. The line impedance from the terminal M until the fault points F 131 and 181 are denoted as $Z_F$. The phase-to-phase and the phase-to-ground components of the fault resistance are denoted as $R_{pp}$, and $R_{pg}$, respectively. The electrical loop formed by the faults in the phase B and the phase C comprising $Z_F$, $R_{pp}$, and $R_{pg}$ is referred to as a phase-to-phase-to-ground loop.

An apparent impedance calculation method comprises the following steps:

Applying Kirchhoff's Voltage Law (KVL) to the first phase-to-ground (phase B-to-ground) loop, a first voltage equation is obtained as:

$$V_{BM} = Z_F(I_{BM}) + R_{pp}(I_{BM} + I_{BN}) + R_{pg}(I_{BM} + I_{CM} + I_{BN} + I_{CN}) \quad (1)$$

and similarly, applying KVL to the second phase-to-ground (phase C-to-ground) loop, a second voltage equation is obtained as:

$$V_{CM} = Z_F(I_{CM}) + R_{pp}(I_{CM} + I_{CN}) + R_{pg}(I_{BM} + I_{CM} + I_{BN} + I_{CN}) \quad (2)$$

Calculating the voltage difference between eq. (1) and eq.(2), assuming, $R_{pp}=R_{pg}$, leads to:

$$V_{BM} - V_{CM} = Z_F I_{CM} + R_F(I_{BM} - I_{CM} + I_{BN} - I_{CN}) \quad (3)$$

where, $R_F$ denotes a fault resistance and is equivalent to $R_{pp}=R_{pg}$. Dividing both sides of eq.(3) by the current difference, $I_{BM}-I_{CM}$, yields a conventional apparent impedance:

$$Z_{app} = \frac{V_{BM} - V_{CM}}{I_{BM} - I_{CM}} = Z_F + R_F\left(\frac{I_{BM} - I_{CM} + I_{BN} - I_{CN}}{I_{BM} - I_{CM}}\right). \quad (4)$$

Herein, N and D denote the numerator and the denominator of the term $$\left(\frac{I_{BM} - I_{CM} + I_{BN} - I_{CN}}{I_{BM} - I_{CM}}\right)$$

in eq.(4). N and D are complex current terms, thus as the phase angle between N and D converges to zero, the term $$\left(\frac{I_{BM} - I_{CM} + I_{BN} - I_{CN}}{I_{BM} - I_{CM}}\right)$$

converges to a real value. This is true when the difference among the phase angles of the line impedance, the source impedance at the terminals M 112 and 162, and the source impedance at the terminals N 111 and 161 are minimal, which in turn renders the imaginary part of the term $$\left(\frac{I_{BM} - I_{CM} + I_{BN} - I_{CN}}{I_{BM} - I_{CM}}\right)$$

negligible. A homogeneous system refers to a system where the phase angle between N and D is negligible, rendering the term $$\left(\frac{I_{BM} - I_{CM} + I_{BN} - I_{CN}}{I_{BM} - I_{CM}}\right)$$

mostly real. In contrast, a non-homogenous system refers to a system where the phase angle between N and D is not negligible, rendering the term $$\left(\frac{I_{BM} - I_{CM} + I_{BN} - I_{CN}}{I_{BM} - I_{CM}}\right)$$

to comprise a significant imaginary part. As evident from eq. (4), the imaginary part of the computed apparent impedance $Z_{app}$ in eq.(4) varies linearly with $R_F$ and the imaginary part of the term $$\left(\frac{I_{BM} - I_{CM} + I_{BN} - I_{CN}}{I_{BM} - I_{CM}}\right).$$

Thus, a non-homogenous system with high $R_F$ causes a significant shift in the reactance of the computed apparent impedance $Z_{app}$ in eq.(4). The effect of the significant reactance shift in the computed apparent impedance $Z_{app}$ in eq.(4) will be illustrated in the following description with the accompanying figures. Herein, computing an apparent impedance according to eq. (4) is referred to as a first method to compute an apparent impedance. Consequently, the first apparent impedance refers to the apparent impedance computed according to the first method.

FIG. 3 illustrates the performance of apparent impedance, computed according to the first method, in a homogenous and a non-homogenous system presented in FIG. 1a), considering zero ohm fault resistance (equivalently, $R_F$=0Ω).

The angular plots 351 and 352 illustrate the simulation results of the phase angle difference between the numerator (N) 301 and the denominator (D) 302 of the term $$\left(\frac{I_{BM} - I_{CM} + I_{BN} - I_{CN}}{I_{BM} - I_{CM}}\right)$$

in eq.(4) over a measurement period, in a homogenous system and a non-homogenous system. The y-axis of the angular plots 351 and 352 is angle in degrees and the x-axis thereof is time. The phase-to-phase-to-ground fault at 60% is assumed, resulting in an actual fault apparent impedance $Z_{true}$=2.14+30.46j, where j denotes the imaginary number, and the fault inception is at 0.1 s. The trajectory plots 353 and 354 illustrate the simulation results of the trajectory of the respective apparent impedance 311 and the zone-1 impedance boundary 312. The respective trajectory of the apparent impedances 311 in the trajectory plots 353 and 354 follows the first apparent impedance over time within the time frames presented in the angular plots 351 and 352. The y-axis of the trajectory plots 353 and 354 is imaginary value and the x-axis thereof is real value. The apparent impedance calculations 355 and 356 compute the apparent impedances of the phase-to-phase-to-ground fault using eq. (4) and represent the settling apparent impedances at which the respective trajectory of the apparent impedance 311 arrives eventually within the timeframe presented in the angular plots 351 and 352.

In a homogenous system, the phase angle difference between the numerator 301 and the denominator 302, measured after the fault inception, is approximately 12°. The apparent impedance calculation 355 shows that, for a system with $R_F$=0Ω, the term $$\left(\frac{I_{BM} - I_{CM} + I_{BN} - I_{CN}}{I_{BM} - I_{CM}}\right)$$

does not cause any reactance shift in the computed apparent impedance. Thus, the first apparent impedance computed in the apparent impedance calculation 355 is equal to the actual fault impedance.

In a non-homogenous system, the phase angle difference between the numerator 301 and the denominator 302, measured after the fault inception, is approximately 36°. The apparent impedance calculation 356 shows that, for a system with $R_F=0\Omega$, the term $$\left(\frac{I_{BM}-I_{CM}+I_{BN}-I_{CN}}{I_{BM}-I_{CM}}\right)$$

does not cause any reactance shift, despite the significant phase angle difference, in the apparent impedance computed in the apparent impedance calculation 356.

Thus, the apparent impedance computed in the apparent impedance calculation 356 is equal to the actual fault impedance.

FIG. 4 illustrates the performance of the apparent impedance, computed according to the first method, in a homogenous and a non-homogenous system presented in FIG. 1$a$), considering 20 Ohm fault resistance (equivalently, $R_F=20\Omega$).

The angular plots 451 and 452 illustrate the simulation results of the phase angle difference between the numerator (N) 401 and the denominator (D) 402 of the term $$\left(\frac{I_{BM}-I_{CM}+I_{BN}-I_{CN}}{I_{BM}-I_{CM}}\right)$$

in eq.(4) over a measurement period, in a homogenous system and a non-homogenous system, respectively. The y-axis of the angular plots 451 and 452 is angle in degrees and the x-axis thereof is time. The phase-to-phase-to-ground fault at 60% is assumed, resulting in an actual fault apparent impedance $Z_{true}$=2.14+30.46j, where j denotes the imaginary number, and the fault inception is at 0.1 s. The trajectory plots 453 and 454 illustrate the simulation results of the trajectory of the respective apparent impedance 411 and the zone-1 impedance boundary 412. The respective trajectory of the apparent impedance 411 in the trajectory plots 453 and 454 follows the first apparent impedance overtime within the time frames presented in the angular plots 451 and 452. The y-axis of the trajectory plots 453 and 454 is imaginary value and the x-axis thereof is real value. The apparent impedance calculations 455 and 456 compute the apparent impedances of the phase-to-phase-to-ground fault using eq. (4) and represent the settling apparent impedances at which the respective trajectory of the apparent impedance 411 arrives eventually within the timeframe presented in the angular plots 451 452.

In a homogenous system, the phase angle difference between the numerator 401 and the denominator 402, measured after the fault inception, is approximately 8°. The apparent impedance calculation 455 shows that, for a system with $R_F=20\Omega$, the term $$\left(\frac{I_{BM}-I_{CM}+I_{BN}-I_{CN}}{I_{BM}-I_{CM}}\right)$$

causes a shift in both real and imaginary components of the apparent impedance. Nevertheless, the computed apparent impedance still resides within the zone-1 boundary. In other words, the fault is determined to have occurred within the distance covered by the two terminals, BUS M 112 and BUS N 111.

In a non-homogenous system, the phase angle difference between the numerator 401 and the denominator 402, measured after the fault inception, is approximately 30°. The apparent impedance calculation 456 shows that, for a system with $R_F=20\Omega$, the term $$\left(\frac{I_{BM}-I_{CM}+I_{BN}-I_{CN}}{I_{BM}-I_{CM}}\right)$$

causes a shift in both real and imaginary components of the apparent impedance. As a result, the apparent impedance does not settle to a point within the zone-1 boundary. In other words, the fault is determined to not have occurred within the distance covered by the two terminals, BUS M 112 and BUS N 111.

FIG. 5 illustrates the performance of the apparent impedance, calculated according to the first method, in a non-homogenous system, in particular as presented in FIG. 1$b$), considering 0 Ohm and 20 Ohm fault resistance.

The angular plots 551 and 552 illustrate the simulation results of the phase angle difference between the numerator (N) 501 and the denominator (D) 502 of the term $$\left(\frac{I_{BM}-I_{CM}+I_{BN}-I_{CN}}{I_{BM}-I_{CM}}\right)$$

in eq.(4) over a measurement period, in a non-homogenous system considering 0 Ohm and 20 Ohm fault resistance. The y-axis of the angular plots 551 and 552 is angle in degrees and the x-axis thereof is time. The phase-to-phase-to-ground fault at 60% is assumed, resulting in an actual fault apparent impedance $Z_{true}$=2.14+30.46j, where j denotes imaginary number, and the fault inception is at 0.6 s. The trajectory plots 553 and 554 illustrate the simulation results of the trajectory of the respective apparent impedances 511 and the zone-1 impedance boundary 512. The respective trajectory of the apparent impedances 511 in the trajectory plots 553 and 554 follows the apparent impedance calculation over time within the time frames presented in the angular plots 551 and 552. The y-axis of the trajectory plots 553 and 554 is imaginary value and the x-axis thereof is real value. The apparent impedance calculations 555 and 556 compute the apparent impedances of the phase-to-phase-to-ground fault using eq.(4) and represent the settling apparent impedances at which the respective trajectory of apparent impedances 511 arrives eventually within the timeframe presented in the angular plots 551 and 552.

In a non-homogenous system, the phase angle difference between the numerator 501 and the denominator 502, measured after the fault inception, is approximately 70°. The apparent impedance calculation 555 shows that, for a system with $R_F=0\Omega$, the term $$\left(\frac{I_{BM}-I_{CM}+I_{BN}-I_{CN}}{I_{BM}-I_{CM}}\right)$$

does not cause any reactance shift, despite the significant phase angle difference, in the computed apparent impedance. Thus, the apparent impedance computed in the apparent impedance calculation 555 is equal to the actual fault impedance.

In a non-homogenous system, the phase angle difference between the numerator 501 and the denominator 502, measured after the fault inception, is approximately 79°. The apparent impedance calculation 556 shows that for a system with $R_F = 20\Omega$, the term $$\left( \frac{I_{BM} - I_{CM} + I_{BN} - I_{CN}}{I_{BM} - I_{CM}} \right)$$

causes a shift in both real and imaginary components of the apparent impedance. As a result, the apparent impedance does not settle to a point within the zone-1 boundary 512. In other words, the fault is determined to not have occurred within the distance covered by the two terminals, BUS M 162 and BUS N 161.

As evident from the above presented examples, the performance of the apparent impedance calculated according to the first method deteriorates when applied to non-homogenous transmission line systems, in particular systems comprising an asynchronous generator. Especially, in case of the phase-to-phase-to-ground faults, the combined impact of the phase angle difference between the local and the remote currents, and the fault resistance, causes the reactance of the calculated apparent impedance to severely overreach, such that the impedance trajectory settles to a point outside of the zone-1 boundary. Consequently, the fault is determined to not have occurred within the distance covered by the two terminals.

Thus, there is a need to improve the computational method used to calculate the apparent impedance of the transmission line in case of the phase-to-phase-to-ground faults for the distance protection implemented in a non-homogeneous transmission system comprising synchronous generators and/or DERs, in particular asynchronous generators. As described above, the traditional method computes apparent impedances, the reactance part of which severely overreaches, even to the extent that the impedance trajectory enters the fourth quadrant of the quadrilateral characteristic. Such issue is advantageously solved by the present disclosure by comprising the zero-sequence components into the computation of the apparent impedances. Particularly, in case of IBR-connected lines, the zero-sequence current is not restricted by the converter control system as it is supplied by the transformer. Furthermore, the magnitude of the zero-sequence current is higher than the positive sequence currents for these systems.

The present disclosure relates to a method for distance of a transmission line carrying a plurality of phases, the method comprising: obtaining a first impedance of a first electrical loop formed by a first phase carried on the transmission line and a ground potential based on a zero-sequence current; obtaining a second impedance of a second electrical loop formed by a second phase carried on the transmission line and a ground potential based on the zero-sequence current; computing an apparent impedance of the transmission line seen at a first terminal based on the first impedance and the second impedance; and performing the distance protection based on the apparent impedance.

The present disclosure also relates to a method for distance protection of a transmission line carrying a plurality of phases for a phase-to-phase-to-ground fault comprising a first phase and a second phase of the plurality of phases as faulted phases in the phase-to-phase-to-ground fault, wherein the first phase is different from the second phase, the method comprising: obtaining a first impedance of a first electrical loop formed by the first phase carried on the transmission line and a ground potential based on a zero-sequence current; obtaining a second impedance of a second electrical loop formed by the second phase carried on the transmission line and a ground potential based on the zero-sequence current; computing an apparent impedance of the transmission line seen at a first terminal based on the first impedance and the second impedance; and performing the distance protection based on the apparent impedance.

Various embodiments may preferably implement the following features:

According to an embodiment, the plurality of phases is or comprises a first phase, a second phase, and a third phase. The plurality of phases may comprise at least one further phase, e.g., a fourth, a fifth, a sixth, and so forth phase.

According to an embodiment, the first phase of the plurality of phases is a first faulted phase of the phase-to-phase-to-ground fault.

According to an embodiment, the second phase of the plurality of phases is a second faulted phase of the phase-to-phase-to-ground fault.

According to an embodiment, the first impedance is an apparent impedance seen at the first terminal for the first phase. According to an embodiment, the first impedance is determined based on voltage of the first phase measured at the first terminal and current of the first phase measured at the first terminal. According to an embodiment, the first impedance is determined based on current of all respective plurality of phases, in particular the zero-sequence computed therefrom.

According to an embodiment, the second impedance is an apparent impedance seen at the first terminal for the second phase. According to an embodiment, the second impedance is determined based on voltage of the second phase measured at the first terminal and current of the first phase measured at the first terminal. According to an embodiment, the second impedance is determined based on current of all respective plurality of phases, in particular the zero-sequence computed therefrom.

According to an embodiment, computing the apparent impedance of the transmission line is or comprises combining, in particular linearly combining, more particularly averaging, the first impedance and the second impedance. According to an embodiment, the computed apparent impedance of the transmission line is an, apparent, impedance seen at the first terminal, in particular looking into the direction of the phase-to-phase-to-ground fault on the transmission line, when the phase-to-phase-to-ground fault occurs. According to an embodiment, the computed apparent impedance is computed based on current and voltage measured at first terminal when the phase-to-phase-to-ground fault occurs. Accordingly, the computed apparent impedance of the transmission line may be an equivalent impedance of the faulted first and second phases of the transmission line in the phase-to-phase-to-ground phase. The voltage measured at the first terminal based on which the apparent impedance is computed is voltage of the first phase and of the second phase measured at the first terminal. The current measured at the first terminal based on which the apparent impedance is computed is current of all respective plurality of phases, in particular the zero-sequence computed therefrom.

According to an embodiment, the method comprises: computing the first impedance of a first electrical loop formed by a first phase carried on the transmission line and a ground potential based on a zero-sequence current and computing the second impedance of a second electrical loop formed by a second phase carried on the transmission line and a ground potential based on the zero-sequence current. In other words, according to an embodiment, the first impedance and/or the second impedance are computed instead of or in addition to obtaining the first impedance and/or the second impedance.

According to an embodiment, the apparent impedance of the transmission line comprises the zero-sequence current.

According to an embodiment, performing the distance protection comprises controlling a distance protection relay.

According to an embodiment, the method comprises identifying a point of a phase-to-phase-to-ground fault based on the computed apparent impedance.

According to an embodiment, the method comprises determining if the identified point of phase-to-phase-to-ground fault lies within the distance between the first terminal and the second terminal.

According to an embodiment, computing the apparent impedance comprises computing a mean of the first impedance and the second impedance.

According to an embodiment, obtaining the first impedance and the second impedance and/or computing the apparent impedance of the transmission line relay is performed by at least one of a relay, a controller, a server, or a cloud.

According to an embodiment, the transmission line is any one of a parallel line, a coaxial cable, a planar transmission line, or a radial line.

According to an embodiment, the first terminal is coupled to a first generator and/or is terminating the transmission line.

According to an embodiment, the transmission line is further terminated by a second terminal and/or a second generator is coupled to the second terminal.

According to an embodiment, the first generator and/or the second generator comprises and/or is a synchronous generator or an asynchronous generator, in particular a renewable power plant, more particularly an inverter-based resource, IBR. According to an embodiment, the zero-sequence current is a phasor sum of the phase currents.

According to an embodiment, the zero-sequence current is in a transmission line, in particular an IBR-connected line, not restricted by the converter control system as it is supplied by a transformer of a generator.

According to an embodiment, the magnitude of the zero-sequence current is higher than the positive sequence current.

According to an embodiment, any combination of phases may cause a phase-to-phase-to-ground fault.

The present disclosure also relates to a device for protection of a transmission line carrying a plurality of phases, the device comprising a processor being configured to: obtain a first impedance of a first electrical loop formed by a first phase carried on the transmission line and a ground potential based on a zero-sequence current; obtain a second impedance of a second electrical loop formed by a second phase carried on the transmission line and a ground potential based on the zero-sequence current; compute an apparent impedance of the transmission line seen at a first terminal coupled to a first generator based on the first impedance and the second impedance; and perform the distance protection based on the apparent impedance.

The present disclosure further relates to a device for distance protection of a transmission line carrying a plurality of phases for a phase-to-phase-to-ground fault comprising a first phase and a second phase of the plurality of phases as faulted phases in the phase-to-phase-to-ground fault, wherein the first phase is different from the second phase, the device comprising a processor being configured to: obtain a first impedance of a first electrical loop formed by the first phase carried on the transmission line and a ground potential based on a zero-sequence current; obtain a second impedance of a second electrical loop formed by the second phase carried on the transmission line and a ground potential based on the zero-sequence current; compute an apparent impedance of the transmission line seen at a first terminal coupled to a first generator based on the first impedance and the second impedance; and perform the distance protection based on the apparent impedance.

According to an embodiment, the plurality of phases is or comprises a first phase, a second phase, and a third phase. The plurality of phases may comprise at least one further phase, e.g., a fourth, a fifth, a sixth, and so forth phase.

According to an embodiment, the first phase of the plurality of phases is a first faulted phase of the phase-to-phase-to-ground fault.

According to an embodiment, the second phase of the plurality of phases is a second faulted phase of the phase-to-phase-to-ground fault.

According to an embodiment, the first impedance is an apparent impedance seen at the first terminal for the first phase. According to an embodiment, the first impedance is determined based on voltage of the first phase measured at the first terminal and current of the first phase measured at the first terminal. According to an embodiment, the first impedance is determined based on current of all respective plurality of phases, in particular the zero-sequence computed therefrom.

According to an embodiment, the second impedance is an apparent impedance seen at the first terminal for the second phase. According to an embodiment, the second impedance is determined based on voltage of the second phase measured at the first terminal and current of the first phase measured at the first terminal. According to an embodiment, the second impedance is determined based on current of all respective plurality of phases, in particular the zero-sequence computed therefrom.

According to an embodiment, the processor is configured to compute the apparent impedance of the transmission line by combining, in particular linearly combining, more particularly averaging, the first impedance and the second impedance. According to an embodiment, the computed apparent impedance of the transmission line is an, apparent, impedance seen at the first terminal, in particular looking into the direction of the phase-to-phase-to-ground fault on the transmission line, when the phase-to-phase-to-ground fault occurs. According to an embodiment, the computed apparent impedance is computed based on current and voltage measured at first terminal when the phase-to-phase-to-ground fault occurs. Accordingly, the computed apparent impedance of the transmission line may be an equivalent impedance of the faulted first and second phases of the transmission line in the phase-to-phase-to-ground phase. The voltage measured at the first terminal based on which the apparent impedance is computed is voltage of the first phase and of the second phase measured at the first terminal. The current measured at the first terminal based on which the apparent impedance is computed is current of all respective plurality of phases, in particular the zero-sequence computed therefrom.

According to an embodiment, the apparent impedance of the transmission line comprises the zero-sequence current.

According to an embodiment, the processor is configured to perform the distance protection by comprising controlling a distance protection relay.

According to an embodiment, the processor is configured to further perform identifying a point of a phase-to-phase-to-ground fault based on the computed apparent impedance.

According to an embodiment, the processor is configured to further perform determining if the identified point of phase-to-phase-to-ground fault lies within the distance between the first terminal and the second terminal.

According to an embodiment, the processor is configured to computing the apparent impedance by comprising computing a mean of the first impedance and the second impedance.

According to an embodiment, the processor is configured to obtain the first impedance and the second impedance and/or compute the apparent impedance of the transmission line relay using at least one of a relay, a controller, a server, or a cloud.

According to an embodiment, the transmission line is any one of a parallel line, a coaxial cable, a planar transmission line, or a radial line.

According to an embodiment, the first terminal is coupled to a first generator and/or is terminating the transmission line.

According to an embodiment, the transmission line is further terminated by a second terminal and/or a second generator is coupled to the second terminal.

According to an embodiment, the first generator and/or the second generator comprises and/or is a synchronous generator or an asynchronous generator, in particular a renewable power plant, more particularly an inverter-based resource, IBR.

According to an embodiment, the zero-sequence current is a phasor sum of the phase currents.

According to an embodiment, the zero-sequence current is in a transmission line, in particular an IBR-connected line, not restricted by the converter control system as it is supplied by a transformer of a generator.

According to an embodiment, the magnitude of the zero-sequence current is higher than the positive sequence current.

According to an embodiment, any combination of phases may cause a phase-to-phase-to-ground fault.

The present disclosure further relates to a system for distance protection of a transmission line carrying a plurality of phases comprising a transmission line and a device according to any one of above-mentioned device embodiments, wherein the device comprises a processor being configured to carry out any one of above-mentioned method embodiments.

Various exemplary embodiments of the present disclosure are directed to providing features that will become readily apparent by reference to the following description when taken in conjunction with the accompanying drawings. In accordance with various embodiments, exemplary systems, methods, and devices are disclosed herein. It is understood, however, that these embodiments are presented by way of example and not limitation, and it will be apparent to those of ordinary skill in the art who read the present disclosure that various modifications to the disclosed embodiments can be made while remaining within the scope of the present disclosure.

Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

In the following, exemplary embodiments of the present disclosure will be described. It is noted that some aspects of any one of the described embodiments may also be found in some other embodiments unless otherwise stated or obvious. However, for increased intelligibility, each aspect will only be described in detail when first mentioned and any repeated description of the same aspect will be omitted.

The above and other aspects and their implementations are described in greater detail in the drawings, the descriptions, and the claims.

FIG. 1a) and b) illustrate schematics of two-terminal transmission line systems connected to generators according to an embodiment of the present disclosure.

FIG. 6 illustrates a flow chart of a method according to an embodiment of the present disclosure.

Figure 1:
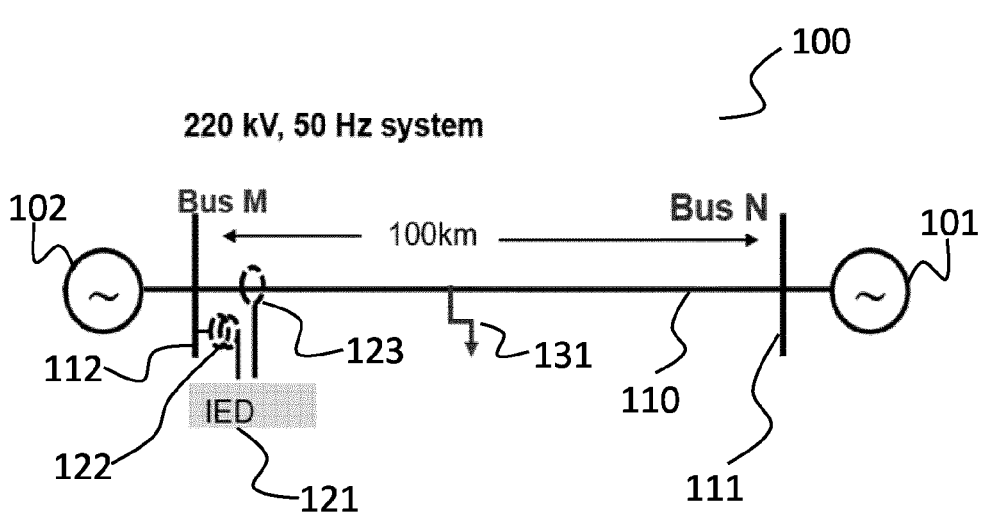
Figure 1:
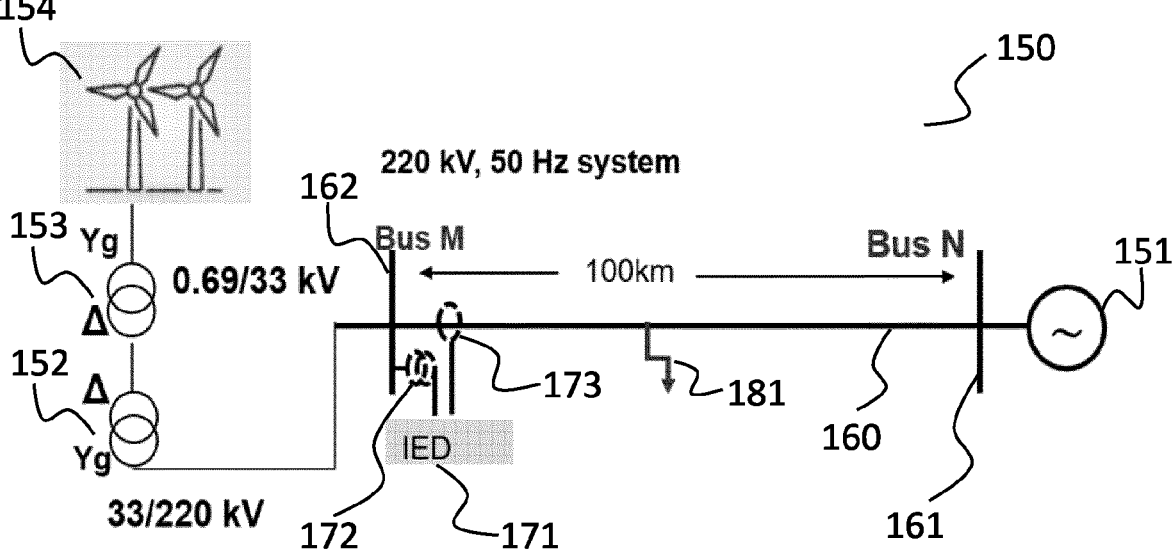
Figure 7:
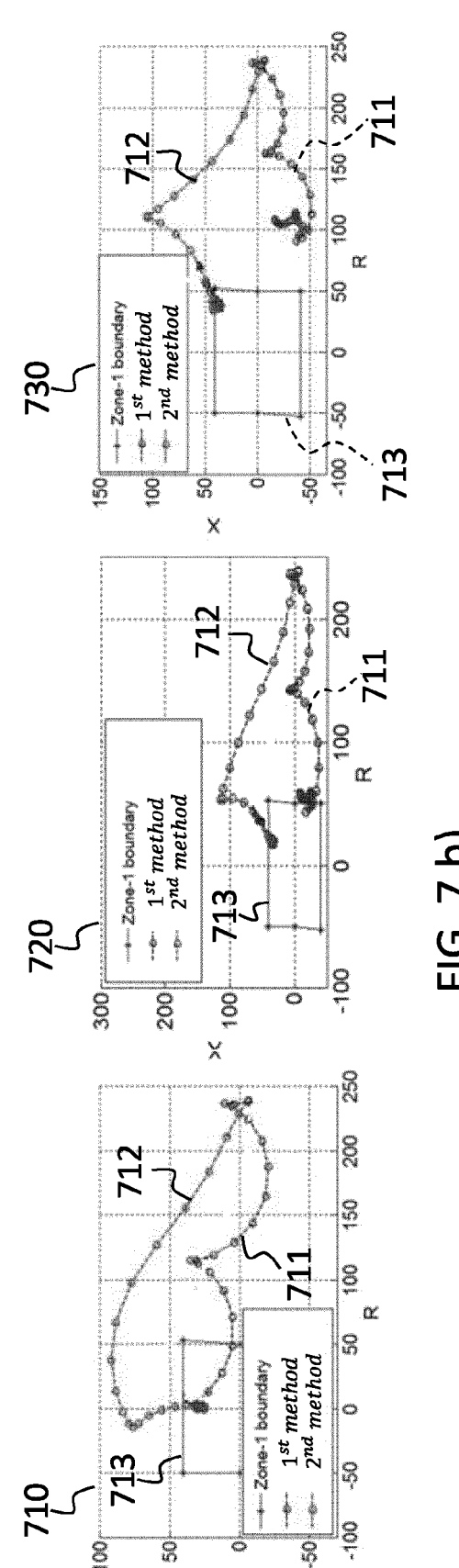

FIG. 7a) and b) illustrate the performance of apparent impedance, calculated according to a first and a second method, in a non-homogenous system presented in FIG. 1b).

Figure 8:
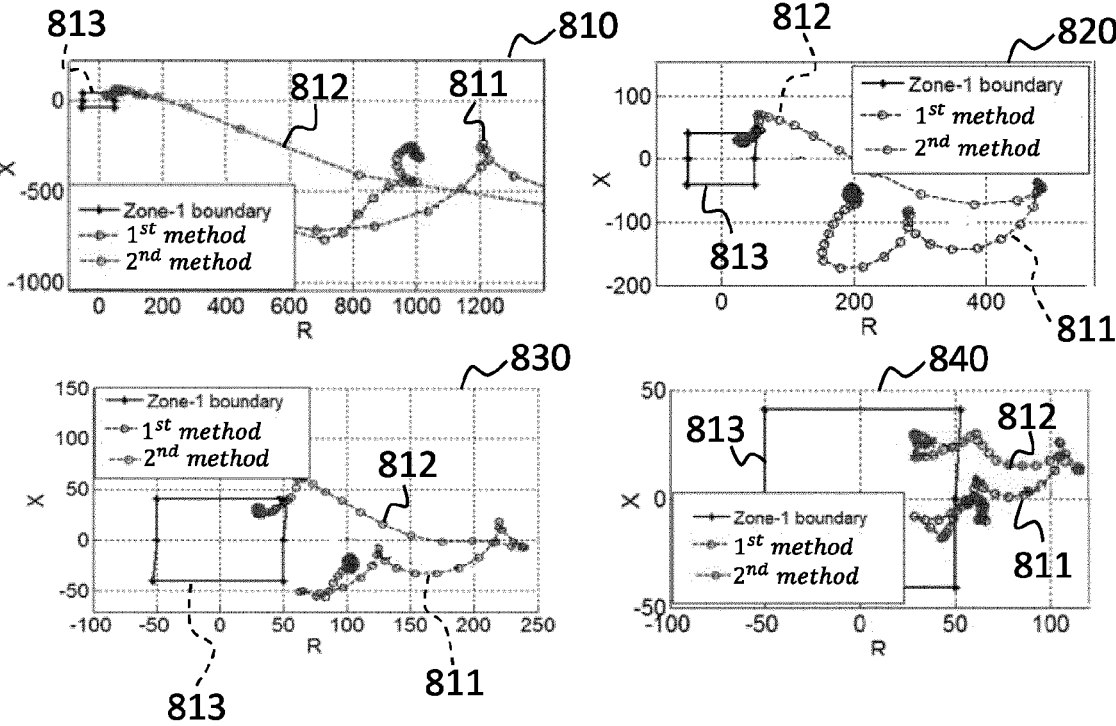

FIG. 8a) and b) illustrate the performance of apparent impedance, calculated according to a first and a second method, in a non-homogenous system presented in FIG. 1b).

Figure 9:
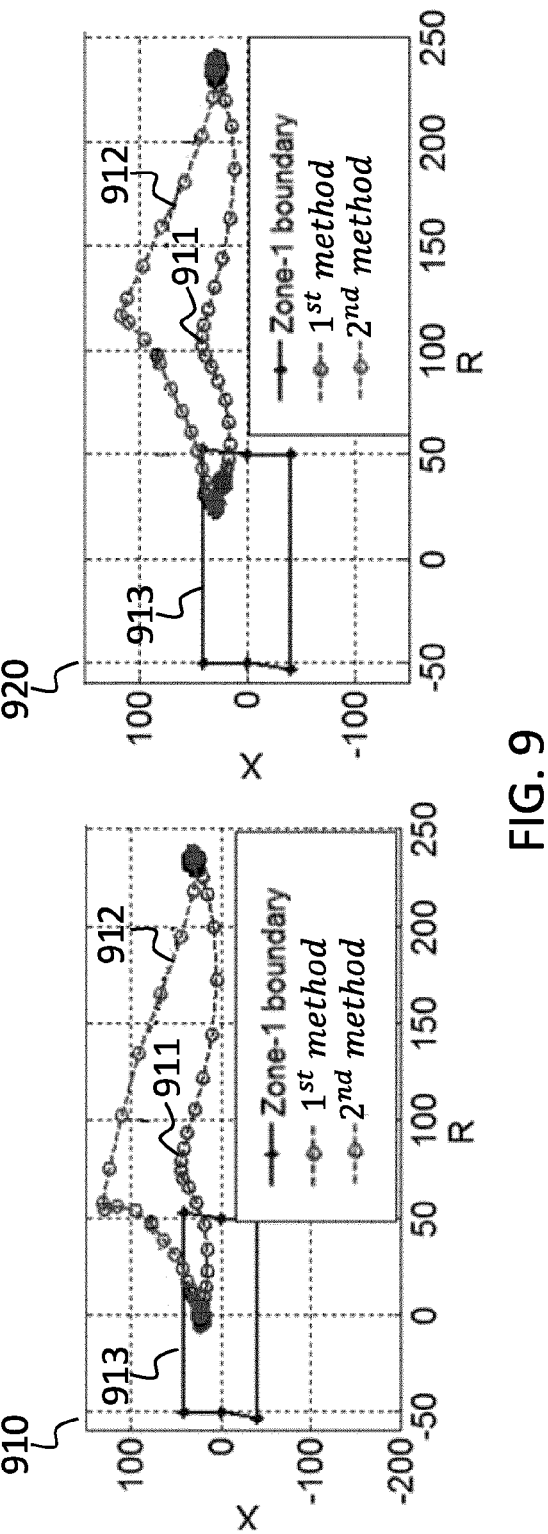

FIG. 9 illustrates the performance of apparent impedance, calculated according to a first and a second method, in a non-homogenous system presented in FIG. 1b).

Figure 10:
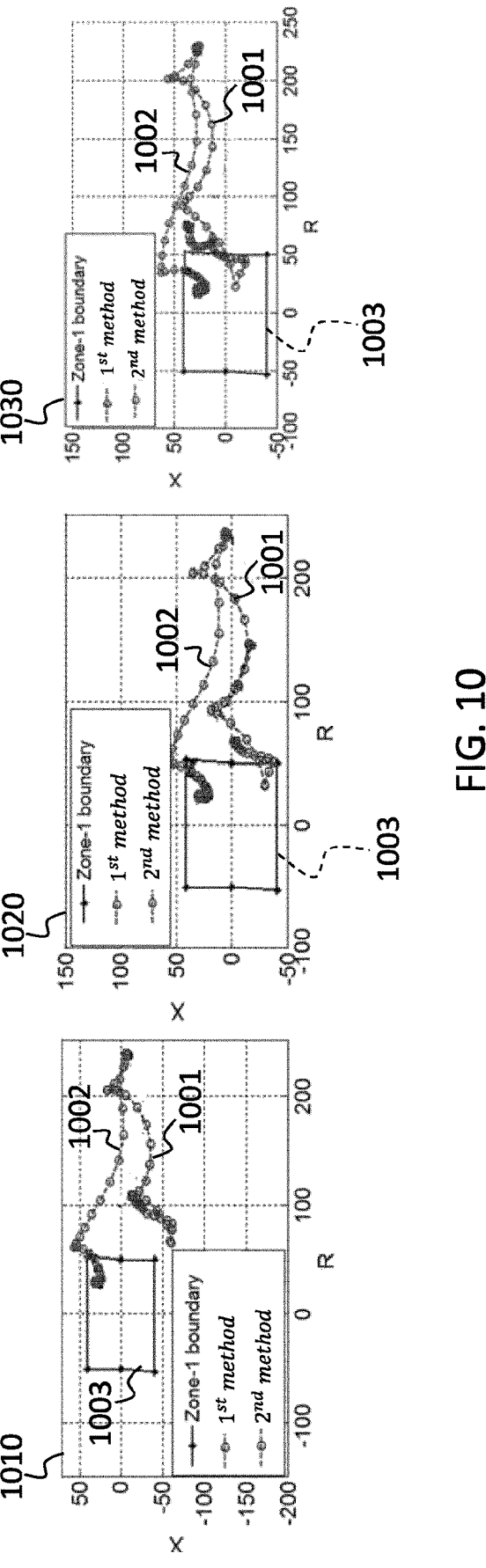

FIG. 10 illustrates the performance of apparent impedance, calculated according to a first and a second method, in a non-homogenous system presented in FIG. 1b).

Figure 11:
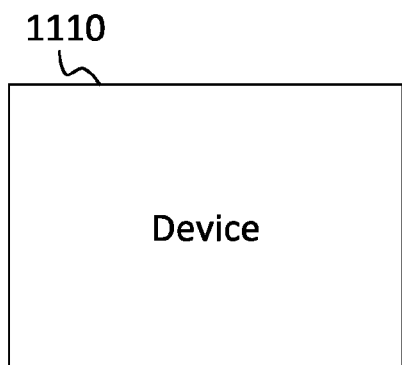
Figure 11:
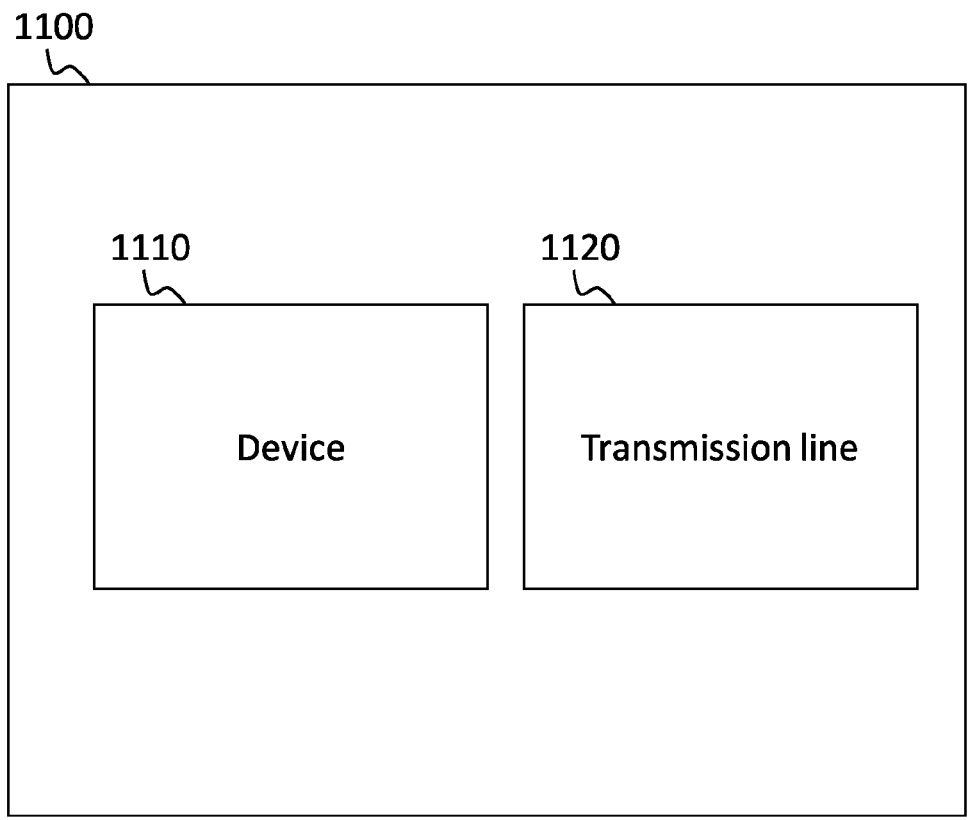

FIG. 11a) and b) illustrate a device and a system comprising the device and a transmission line.

FIG. 6 illustrates a flow chart of a method according to an embodiment of the present disclosure. According to an embodiment, the flowchart illustrated in FIG. 6 is the method for distance protection of a transmission line carrying a plurality of phases, in particular for a phase-to-phase-to-ground fault comprising a first phase and a second phase of the plurality of phases as faulted phases in the phase-to-phase-to-ground fault, wherein the first phase is different from the second phase. Step S601 obtains a first impedance of a first electrical loop formed by a first phase carried on the transmission line and a ground potential based on a zero-sequence current. Sequentially, step S602 obtains a second impedance of a second electrical loop formed by a second phase carried on the transmission line and a ground potential based on the zero-sequence current. Then, step S603 computes an apparent impedance of the transmission line seen at a first terminal based on the first impedance and the second impedance. Then, in step 604, the distance protection is performed based on the apparent impedance.

The calculation of the apparent impedance seen at the first terminal can be alternatively, with equivalence, interpreted as the calculation of apparent impedance seen by, from, or any other equivalence. It is understood by the skilled person that the apparent impedance is defined as the ratio between the voltage and current in the injection point, the first terminal in the present disclosure.

According to an embodiment, the plurality of phases is or comprises a first phase, a second phase, and a third phase. The plurality of phases may comprise at least one further phase, e.g., a fourth, a fifth, a sixth, and so forth phase.

According to an embodiment, the apparent impedance of the transmission line comprises the zero-sequence current.

According to an embodiment, performing the distance protection comprises controlling a distance protection relay.

According to an embodiment, the method comprises identifying a point of a phase-to-phase-to-ground fault based on the apparent impedance.

According to an embodiment, the method comprises determining if the identified point of phase-to-phase-to-ground fault lies within the distance between the first terminal and the second terminal.

According to an embodiment, computing the apparent impedance comprises computing a mean of the first impedance and the second impedance.

According to an embodiment, obtaining the first impedance and the second impedance and/or computing the apparent impedance of the transmission line relay is performed by at least one of a relay, a controller, a server, or a cloud.

According to an embodiment, the transmission line is any one of a parallel line, a coaxial cable, a planar transmission line, or a radial line.

According to an embodiment, the first terminal is coupled to a first generator and/or is terminating the transmission line.

According to an embodiment, the transmission line is further terminated by a second terminal and/or a second generator is coupled to the second terminal.

According to an embodiment, the first generator and/or the second generator comprises and/or is a synchronous generator or an asynchronous generator, in particular a renewable power plant, more particularly an inverter-based resource, IBR. According to an embodiment, zero-sequence current is a phasor sum of the phase currents.

According to an embodiment, the zero-sequence current is in a transmission line, in particular an IBR-connected line, not restricted by the converter control system as it is supplied by a transformer of a generator.

According to an embodiment, the magnitude of the zero-sequence current is higher than the positive sequence current.

According to an embodiment, any combination of phases may cause a phase-to-phase-to-ground fault.

Figure 2:
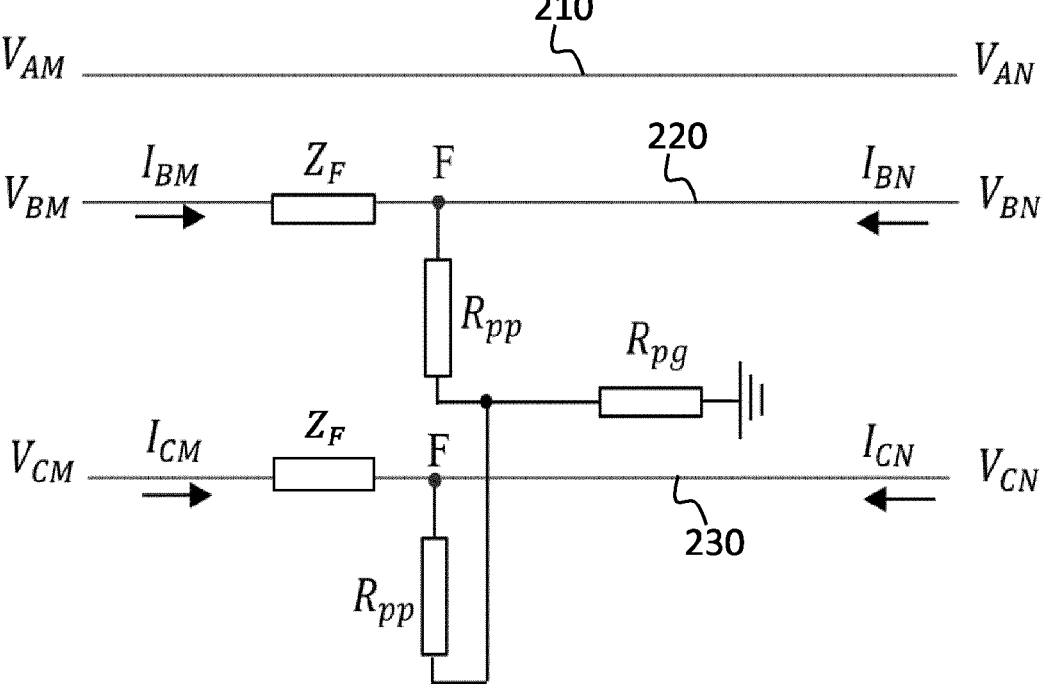
FIG. 2 illustrates an equivalent circuit diagram of phase B-to-phase C-to ground (BC-g) fault in a transmission line system according to an embodiment of the present disclosure.
Figure 3:
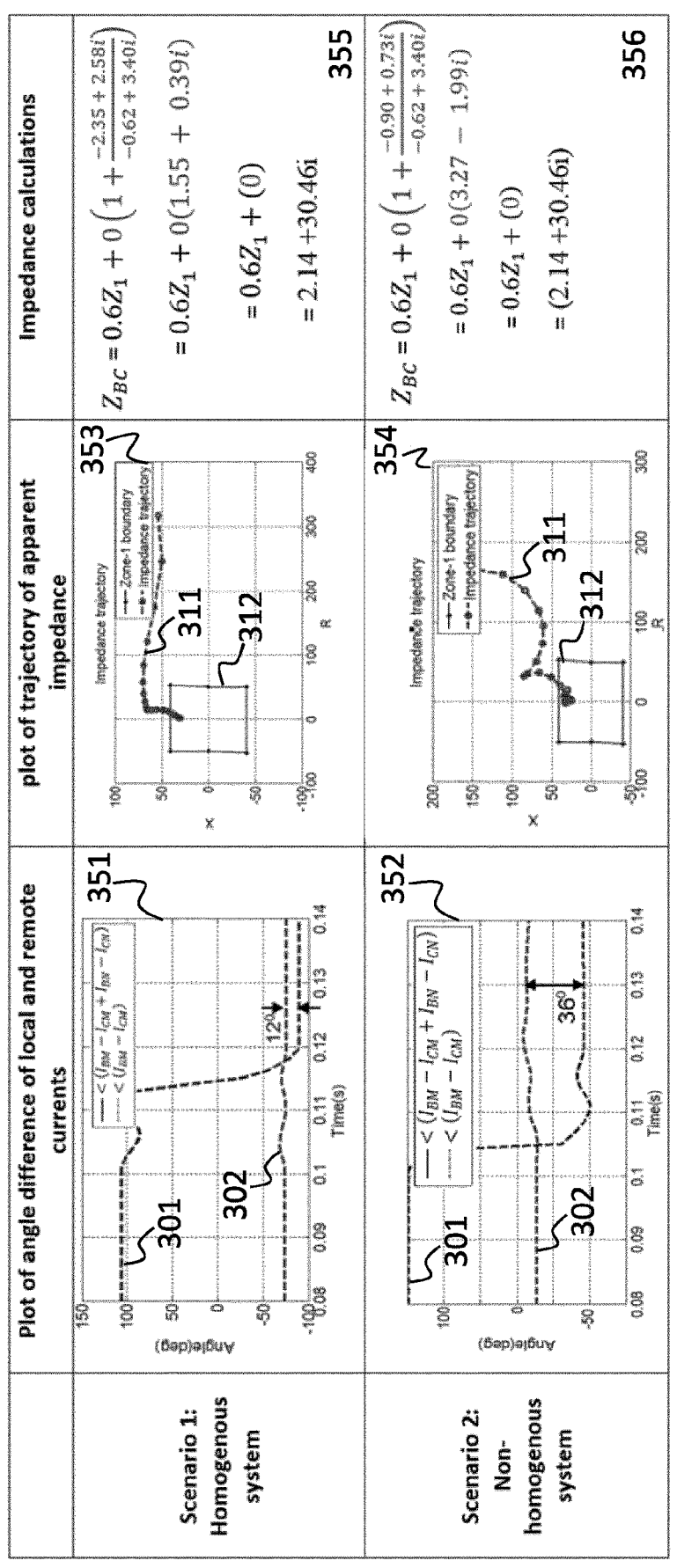
FIG. 3 illustrates the performance of apparent impedance, calculated according to a first method, in a homogenous and a non-homogenous system presented in FIG. 1a).
Figure 4:
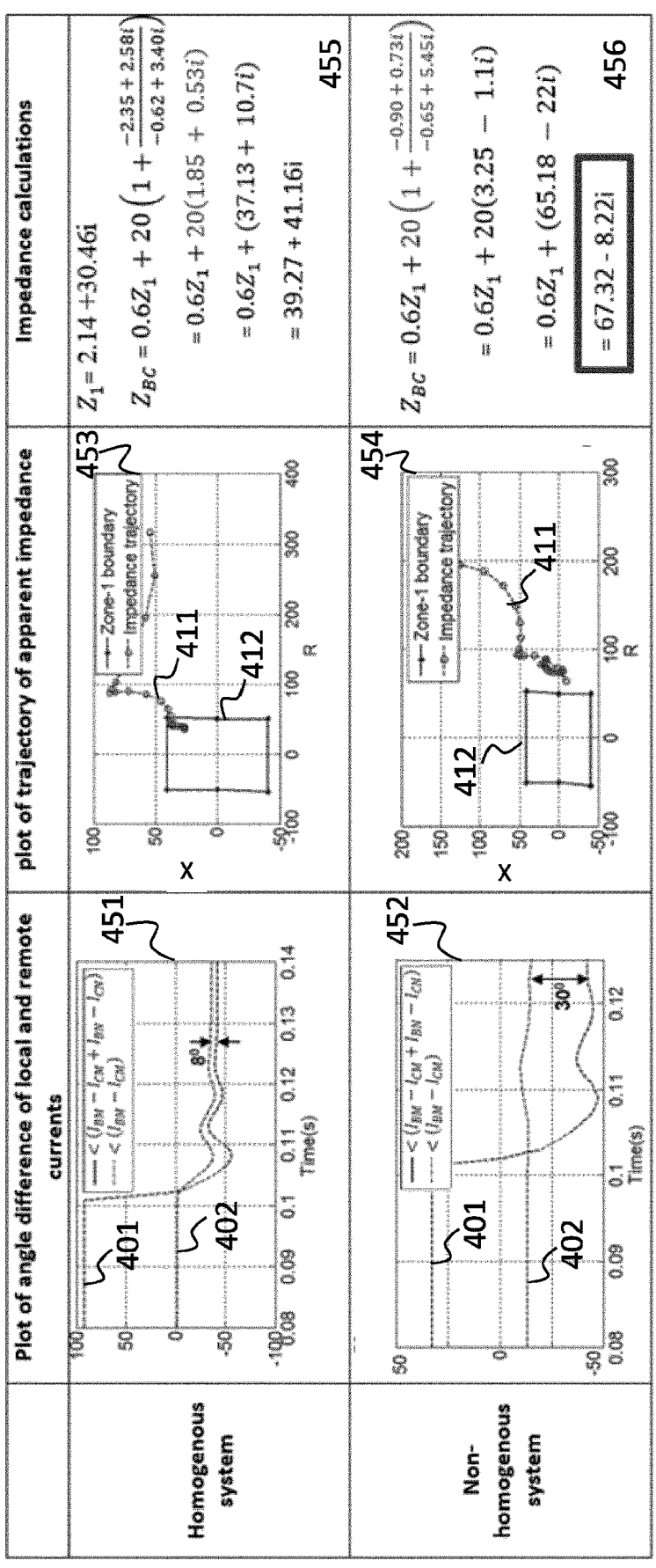
FIG. 4 illustrates the performance of apparent impedance, calculated according to a first method, in a homogenous and a non-homogenous systems presented in FIG. 1a) and FIG. 1b), respectively.
Figure 5:
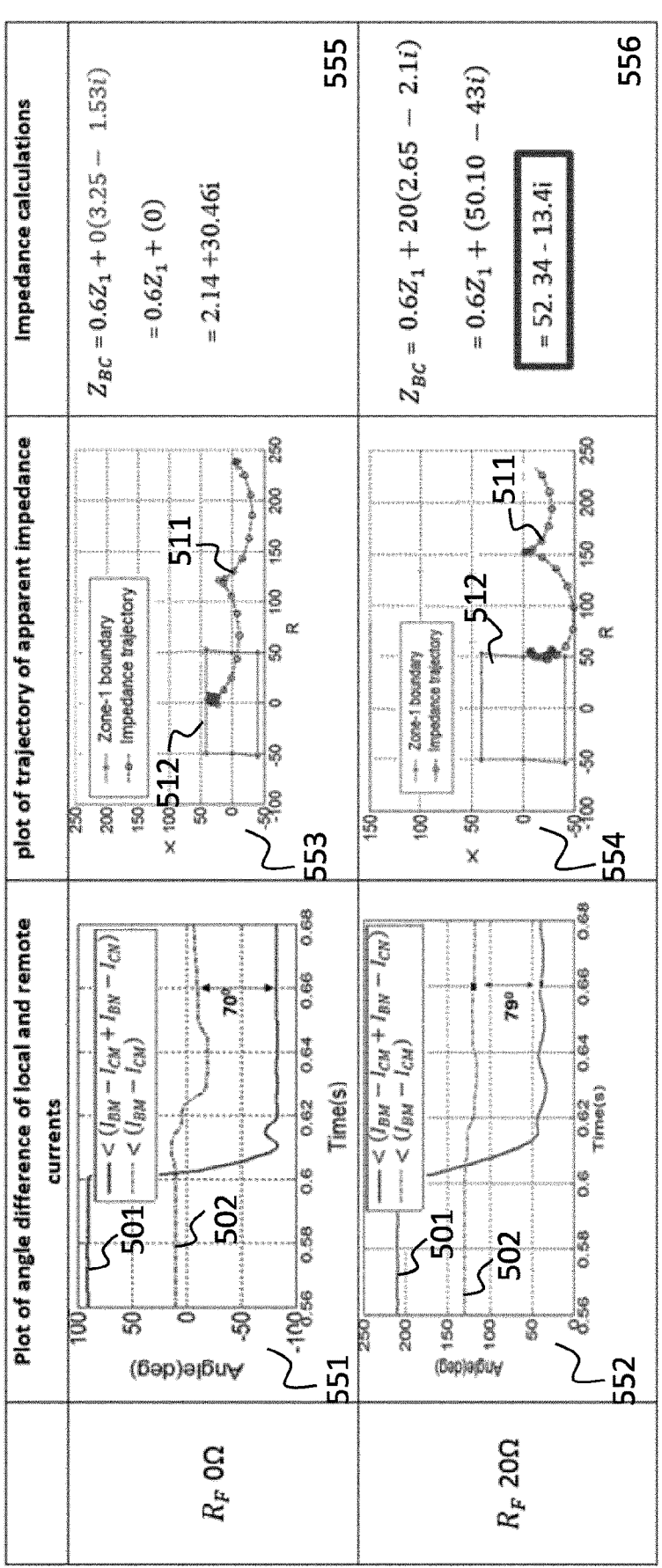
FIG. 5 illustrates the performance of apparent impedance, calculated according to a first method, in a non-homogenous system presented in FIG. 1b).

According to an embodiment, a first voltage equation is obtained by applying Kirchhoff's Voltage Law (KVL) to a first phase-to-ground (phase B-to-ground) loop in FIG. 2 as:

$$V_{BM} = \tag{5}$$

$$Z_F(I_{BM} + K_0 I_{0M}) + R_{pp}(I_{BM} + I_{BN}) + R_{pg}(I_{BM} + I_{CM} + I_{BN} + I_{CN})$$

and similarly, a second voltage equation is obtained by applying Kirchhoff's Voltage Law (KVL) to a second phase-to-ground (phase C-to-ground) loop in FIG. 2 as:

$$V_{CM} = \tag{6}$$

$$Z_F(I_{CM} + K_0 I_{0M}) + R_{pp}(I_{CM} + I_{CN}) + R_{pg}(I_{BM} + I_{CM} + I_{BN} + I_{CN})$$

where, $I_{0M}$ denotes the zero-sequence current at the terminal M, $K_0$ denotes the compensation factor defined by $$\frac{Z_0 - Z_1}{Z_1},$$

and $Z_0$ and $Z_1$ denote the zero- and positive-sequence line impedances, respectively.

A first impedance of the first phase-to-ground loop is obtained based on eq.(5) as:

$$Z_{B-g} = \tag{7}$$

$$\frac{V_{BM}}{I_{BM} + K_0 I_{0M}} = Z_F + \left( \frac{R_{pp}(I_{BM} + I_{BN}) + R_{pg}(I_{BM} + I_{CM} + I_{BN} + I_{CN})}{I_{BM} + K_0 I_{0M}} \right)$$

and similarly, the second impedance of the second phase-to-ground loop is obtained based on eq.(6) as:

$$Z_{C-g} = \tag{8}$$

$$\frac{V_{CM}}{I_{CM} + K_0 I_{0M}} = Z_F + \left( \frac{R_{pp}(I_{CM} + I_{CN}) + R_{pg}(I_{BM} + I_{CM} + I_{BN} + I_{CN})}{I_{CM} + K_0 I_{0M}} \right).$$

Adding the first impedance of eq.(7) and the second impedance of eq.(8) results in:

$$Z_{B-g} + Z_{C-g} = \frac{V_{BM}}{I_{BM} + K_0 I_{0M}} + \frac{V_{CM}}{I_{CM} + K_0 I_{0M}} = 2Z_F + \left( \frac{P}{Q} + \frac{R}{S} \right) \tag{9}$$

where, $$P = R_{pp}(I_{BM} + I_{BN}) + R_{pg}(I_{BM} + I_{CM} + I_{BN} + I_{CN}),$$

$$Q = I_{BM} + K_0 I_{0M},$$

$$R = R_{pp}(I_{CM} + I_{CN}) + R_{pg}(I_{BM} + I_{CM} + I_{BN} + I_{CN}), \text{ and}$$

$$S = I_{CM} + K_0 I_{0M}.$$

An apparent impedance of the phase-to-phase-to-ground loop is computed by dividing eq.(9) by 2:

$$Z_{BC-g} = \frac{Z_{B-g} + Z_{C-g}}{2} = \frac{\frac{V_{BM}}{I_{BM} + K_0 I_{0M}} + \frac{V_{CM}}{I_{CM} + K_0 I_{0M}}}{2} = Z_F + Z' \tag{10}$$

$$\text{where, } Z' = \left( \frac{PS + QR}{2QS} \right).$$

The phase angle of the term Z' is minimal, in particular approximately 0.1°. The effect of minimal phase angle of the term Z', which in turn causes a minimal reactance shift, in the computed apparent impedance $Z_{BC-g}$ in eq.(8) will be illustrated in the following description with accompanying figures.

According to an embodiment, the first phase (phase-B in the above-described embodiment) of the plurality of phases is a first faulted phase of the phase-to-phase-to-ground fault (phase B-to-phase C-to-ground fault in the above-described embodiment).

According to an embodiment, the second phase (phase-C in the above-described embodiment) of the plurality of phases is a second faulted phase of the phase-to-phase-to-ground fault (phase B-to-phase C-to-ground fault in the above-described embodiment).

According to an embodiment, the first impedance (impedance computed according to eq.(7) in the above-described embodiment) is an apparent impedance seen at the first terminal for the first phase (phase-B in the above-described embodiment). According to an embodiment, the first impedance is determined based on voltage of the first phase measured at the first terminal and current of the first phase measured at the first terminal. According to an embodiment, the first impedance is determined based on current of all respective plurality of phases, in particular the zero-sequence computed therefrom.

According to an embodiment, the second impedance (impedance computed according to eq.(8) in the above-described embodiment) is an apparent impedance seen at the first terminal for the second phase (phase-C in the above-described embodiment). According to an embodiment, the second impedance is determined based on voltage of the second phase measured at the first terminal and current of the first phase measured at the first terminal. According to an embodiment, the second impedance is determined based on current of all respective plurality of phases, in particular the zero-sequence computed therefrom.

According to an embodiment, computing the apparent impedance of the transmission line is or comprises combining, in particular linearly combining, more particularly averaging (for instance, eq.(10)), the first impedance and the second impedance. According to an embodiment, the computed apparent impedance (impedance computed according to eq.(10) in the above-described embodiment) of the transmission line is an, apparent, impedance seen at the first terminal, in particular looking into the direction of the phase-to-phase-to-ground fault on the transmission line, when the phase-to-phase-to-ground fault occurs. According to an embodiment, the computed apparent impedance is computed based on current and voltage measured at first terminal when the phase-to-phase-to-ground fault occurs. Accordingly, the computed apparent impedance of the transmission line may be an equivalent impedance of the faulted first and second phases of the transmission line in the phase-to-phase-to-ground phase. The voltage measured at the first terminal based on which the apparent impedance is computed is voltage of the first phase and of the second phase measured at the first terminal. The current measured at the first terminal based on which the apparent impedance is computed is current of all respective plurality of phases, in particular the zero-sequence computed therefrom.

Herein, computing an apparent impedance according to eq. (10) is referred to as a second method to compute an apparent impedance. Consequently, the second apparent impedance refers to the apparent impedance computed according to the second method.

FIG. 7a) and b) illustrate the performance of the apparent impedances, calculated according to the first and the second method, in a non-homogenous system presented in FIG. 1b), considering 0 Ohm, 10 Ohm, and 20 Ohm fault resistance.

A table presented in FIG. 7a) summarizes computed first apparent impedances 711 computed with the first method and second apparent impedances 712 computed with the second method for a non-homogenous system presented in FIG. 1b), considering 0 Ohm, 10 Ohm, and 20 Ohm fault resistance.

FIG. 7b) presents the trajectory plots 710, 720, and 730 which illustrate the simulation results of the trajectories of the first apparent impedances 711 and the second apparent impedances 712, and the zone-1 impedance boundary 713. The y-axis of the trajectory plots 710, 720, and 730 is imaginary value and the x-axis thereof is real value. The computed apparent impedances are summarized in FIG. 7a) and represent the settling apparent impedances at which the respective trajectory of the first apparent impedances 711 and the second apparent impedances 712 arrive eventually. The phase-to-phase-to-ground fault at 60% is assumed, resulting in an actual fault apparent impedance $Z_{true}$=2.14+ 30.46j, where j denotes imaginary number. Alternatively, i denotes the imaginary number, as presented in the table in FIG. 7a).

The first trajectory plot 710 illustrates the first apparent impedance trajectory 711 and the second apparent impedance trajectory 712 considering $R_F$=0Ω, and a second trajectory plot 720 illustrates the first apparent impedance trajectory 711 and the second apparent impedance trajectory 712 considering $R_F$=10Ω. As evident from the first two trajectory plots 710 and 720, the first apparent impedances 711 as well as the second apparent impedances 712 settle to a point within the zone-1 boundary 713, thereby correctly identifying faults within the distance covered by the two terminals, BUS M 162 and BUS N 161.

The third trajectory plot 730 illustrates the first apparent impedance trajectory 711 and the second apparent impedance trajectory 712 considering $R_F$=20Ω. The first apparent impedance 711 fails to settle to a point within the zone-1 boundary 713, resulting in a false fault determination. In contrast, the second apparent impedance 712 settles to a point within the zone-1 boundary 713, thereby correctly identifying faults within the distance covered by the two terminals, BUS M 162 and BUS N 161.

FIG. 8a) and b) illustrate the performance of the apparent impedances calculated according to the first and the second method, in a non-homogenous system presented in FIG. 1b), considering various pre-fault load currents.

The table presented in FIG. 8a) summarizes the computed first apparent impedances 811 and the second apparent impedances 812 for a non-homogenous system presented in FIG. 1b), considering 50A, 370A, 750A, and 1500A pre-fault load currents ($I_{PF}$).

FIG. 8b) presents trajectory plots 810, 820, 830, and 840 which illustrate the simulation results of the trajectories of the first apparent impedances 811 and the second apparent impedances 812, and the zone-1 impedance boundary 813. The y-axis of the trajectory plots 810, 820, 830, and 840 is imaginary value and the x-axis thereof is real value. The computed first apparent impedances and the second apparent impedances summarized in FIG. 8a) represent the settling apparent impedances at which the respective trajectory of the first apparent impedances 811 and the second apparent impedances 812 arrive eventually. The phase-to-phase-to-ground fault at 50% of the line with $R_F$=20Ω is assumed, resulting in an actual fault apparent impedance $Z_{true}$=1.78+

25.39j, where j denotes the imaginary number. Alternatively, i denotes the imaginary number, as presented in the table in FIG. 8a).

The first trajectory plot 810 illustrates the first apparent impedance trajectory 811 and the second apparent impedance trajectory 812 considering $I_{PF}$=50A, the second trajectory plot 820 illustrates the first apparent impedance trajectory 811 and the second apparent impedance trajectory 812 considering $I_{PF}$=370A, and the third trajectory plot 830 illustrates the first apparent impedance trajectory 811 and the second apparent impedance trajectory 812 considering $I_{PF}$=750A. As evident from the first three trajectory plots 810, 820, and 830, the trajectories of the first apparent impedances 811 fail to settle to a point within the zone-1 boundary 813, resulting in a false fault determination. In contrast, the second apparent impedances 812 arrive to a point within the zone-1 boundary 813, thereby correctly identifying the faults within the distance covered by the two terminals, BUS M 162 and BUS N 161.

The fourth trajectory plot 840 illustrates the apparent impedance trajectory considering $I_{PF}$=1500A. The trajectories of the first apparent impedance 811 as well as the second apparent impedance 812 settles to a point within the zone-1 boundary 813, thereby correctly identifying the faults within the distance covered by the two terminals, BUS M 162 and BUS N 161.

FIG. 9 illustrates the performance of the apparent impedances, calculated according to the first and the second method, in a non-homogenous system presented in FIG. 1b), considering a radial line for the transmission line with $R_F$=0Ω and $R_F$=20Ω. FIG. 9 presents the trajectory plots 910 and 920 which illustrate the simulation results of the trajectories of the first apparent impedances 911 and the second apparent impedances 912, and the zone-1 impedance boundary 913. The y-axis of the trajectory plots 910 and 920 is imaginary value and the x-axis thereof is real value. The phase-to-phase-to-ground fault at 50% is assumed for radial lines with $R_F$=0Ω and $R_F$=20Ω. As evident from the trajectory plots 910 and 920, the trajectories of the first apparent impedance 911 as well as the second apparent impedance 912 settles to a point within the zone-1 boundary 913, thereby correctly identifying the faults within the distance covered by the two terminals, BUS M 162 and BUS N 161.

FIG. 10 illustrates the performance of the apparent impedances, calculated according to the first and the second method, in a non-homogenous system presented in FIG. 1b), considering various source-to-line impedance ratios (SIR): SIR=0.3, SIR=1, and SIR=2.

FIG. 10 presents the trajectory plots 1010, 1020, and 1030 which illustrate the simulation results of the trajectories of the first apparent impedances 1001, the second apparent impedances 1002, and the zone-1 impedance boundary 1003. The y-axis of the trajectory plots 1010, 1020, and 1030 is imaginary value and the x-axis thereof is real value. The phase-to-phase-to-ground fault at 50% is assumed for radial lines with $R_F$=20Ω. The first trajectory plot 1010 illustrates the apparent impedance trajectory for SIR=0.3 at the remote terminal 161. As evident from the first trajectory plot 1010, the trajectory of the first apparent impedance 1001 fails to arrive within the zone-1 boundary 1003, resulting in a false fault determination. In contrast, the trajectory of the second apparent impedance 1002 arrives to a point within the zone-1 boundary 1003, thereby correctly identifying faults within the distance covered by the two terminals, BUS M 162 and BUS N 161.

The second trajectory plot 1020 and the third trajectory plot 1030 illustrate that the trajectories of the first apparent impedances 1001 as well as the second apparent impedances 1002 arrive to the respective point within the zone-1 boundary 1003 considering SIR=1 and SIR=2, respectively. Consequently, the faults locations are correctly identified as residing within the distance covered by the two terminals, BUS M 162 and BUS N 161.

FIG. 11a) and b) illustrate a device 1110 and a system 1100 comprising the device 1110 and a transmission line 1120. The transmission line 1120 may be any one of the exemplary transmission lines illustrated in FIG. 1. The device 1110 comprises a processor being configured to perform the steps illustrated in FIG. 6.

According to an embodiment, the device 1110 is for distance protection of a transmission line carrying a plurality of phases. According to an embodiment, the device 1110 is for distance protection of a transmission line carrying a plurality of phases for a phase-to-phase-to-ground fault comprising a first phase and a second phase of the plurality of phases as faulted phases in the phase-to-phase-to-ground fault, wherein the first phase is different from the second phase According to an embodiment, the plurality of phases is or comprises a first phase, a second phase, and a third phase. The plurality of phases may comprise at least one further phase, e.g., a fourth, a fifth, a sixth, and so forth phase.

According to an embodiment, the first phase of the plurality of phases is a first faulted phase of the phase-to-phase-to-ground fault.

According to an embodiment, the second phase of the plurality of phases is a second faulted phase of the phase-to-phase-to-ground fault.

According to an embodiment, the first impedance is an apparent impedance seen at the first terminal for the first phase. According to an embodiment, the first impedance is determined based on voltage of the first phase measured at the first terminal and current of the first phase measured at the first terminal. According to an embodiment, the first impedance is determined based on current of all respective plurality of phases, in particular the zero-sequence computed therefrom.

According to an embodiment, the second impedance is an apparent impedance seen at the first terminal for the second phase. According to an embodiment, the second impedance is determined based on voltage of the second phase measured at the first terminal and current of the first phase measured at the first terminal. According to an embodiment, the second impedance is determined based on current of all respective plurality of phases, in particular the zero-sequence computed therefrom.

According to an embodiment, the processor is configured to compute the apparent impedance of the transmission line by combining, in particular linearly combining, more particularly averaging, the first impedance and the second impedance. According to an embodiment, the computed apparent impedance of the transmission line is an, apparent, impedance seen at the first terminal, in particular looking into the direction of the phase-to-phase-to-ground fault on the transmission line, when the phase-to-phase-to-ground fault occurs. According to an embodiment, the computed apparent impedance is computed based on current and voltage measured at first terminal when the phase-to-phase-to-ground fault occurs. Accordingly, the computed apparent impedance of the transmission line may be an equivalent impedance of the faulted first and second phases of the transmission line in the phase-to-phase-to-ground phase. The voltage measured at the first terminal based on which the apparent impedance is computed is voltage of the first phase and of the second phase measured at the first terminal. The current measured at the first terminal based on which the apparent impedance is computed is current of all respective plurality of phases, in particular the zero-sequence computed therefrom.

According to an embodiment, the apparent impedance of the transmission line comprises the zero-sequence current.

According to an embodiment, the processor is configured to perform the distance protection by comprising controlling a distance protection relay.

According to an embodiment, the processor is configured to further perform identifying a point of a phase-to-phase-to-ground fault based on the computed apparent impedance.

According to an embodiment, the processor is configured to further perform determining if the identified point of phase-to-phase-to-ground fault lies within the distance between the first terminal and the second terminal.

According to an embodiment, the processor is configured to computing the apparent impedance by comprising computing a mean of the first impedance and the second impedance.

According to an embodiment, the processor is configured to obtain the first impedance and the second impedance and/or compute the apparent impedance of the transmission line relay using at least one of a relay, a controller, a server, or a cloud.

According to an embodiment, the transmission line is any one of a parallel line, a coaxial cable, a planar transmission line, or a radial line.

According to an embodiment, the first terminal is coupled to a first generator and/or is terminating the transmission line.

According to an embodiment, the transmission line is further terminated by a second terminal and/or a second generator is coupled to the second terminal.

According to an embodiment, the first generator and/or the second generator comprises and/or is a synchronous generator or an asynchronous generator, in particular a renewable power plant, more particularly an inverter-based resource, IBR.

According to an embodiment, the zero-sequence current is a phasor sum of the phase currents.

According to an embodiment, the zero-sequence current is in a transmission line, in particular an IBR-connected line, not restricted by the converter control system as it is supplied by a transformer of a generator.

According to an embodiment, the magnitude of the zero-sequence current is higher than the positive sequence current.

According to an embodiment, any combination of phases may cause a phase-to-phase-to-ground fault.

The present disclosure further relates to a system for distance protection of a transmission line carrying a plurality of phases comprising a transmission line and a device according to any one of above-mentioned device embodiments, wherein the device comprising a processor being configured to carry out any one of above-mentioned method embodiments.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A skilled person would further appreciate that any of the various illustrative logical blocks, units, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software unit"), or any combination of these techniques.

To clearly illustrate this interchangeability of hardware, firmware and software, various illustrative components, blocks, units, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, unit, etc. can be configured to perform one or more of the functions described herein. The term "configured to" or "configured for" as used herein with respect to a specified operation or function refers to a processor, device, component, circuit, structure, machine, unit, etc. that is physically constructed, programmed and/or arranged to perform the specified operation or function.

Furthermore, a skilled person would understand that various illustrative methods, logical blocks, units, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, units, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein. If implemented in software, the functions can be stored as one or more instructions or code on a computer-readable medium. Thus, the steps of a method or algorithm disclosed herein can be implemented as software stored on a computer-readable medium.

Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

Additionally, memory or other storage, as well as communication components, may be employed in embodiments of the present disclosure. It will be appreciated that, for clarity purposes, the above description has described embodiments of the present disclosure with reference to different functional units and processors. However, it will be apparent that any suitable distribution of functionality between different functional units, processing logic elements or domains may be used without detracting from the present disclosure. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

The invention claimed is:

1. A method for distance protection of a transmission line carrying a plurality of phases for a phase-to-phase-to-ground fault comprising a first phase and a second phase of the plurality of phases as faulted phases in the phase-to-phase-to-ground fault, wherein the first phase is different from the second phase, the method comprising:

obtaining a first impedance of a first electrical loop formed by the first phase carried on the transmission line and a ground potential based on a zero-sequence current;

obtaining a second impedance of a second electrical loop formed by the second phase carried on the transmission line and a ground potential based on the zero-sequence current;

computing an apparent impedance of the transmission line seen at a first terminal based on the first impedance and the second impedance; and performing the distance protection based on the apparent impedance.

2. The method of claim 1, wherein the apparent impedance of the transmission line comprises the zero-sequence current.

3. The method of claim 1, wherein performing the distance protection comprises controlling a distance protection relay.

4. The method of claim 1, further comprising identifying a point of a phase-to-phase-to-ground fault based on the computed apparent impedance.

5. The method of claim 4, further comprising determining if the identified point of phase-to-phase-to-ground fault lies within the distance between the first terminal and the second terminal.

6. The method of claim 1, wherein computing the apparent impedance comprises computing a mean of the first impedance and the second impedance.

7. The method of claim 1, wherein obtaining the first impedance and the second impedance is performed by at least one of a relay, a controller, a server, or a cloud.

8. The method of claim 1, wherein the transmission line is any one of a parallel line, a coaxial cable, a planar transmission line, or a radial line.

9. The method of claim 1, wherein the first terminal is coupled to a first generator and/or is terminating the transmission line.

10. The method of claim 9, wherein the transmission line is further terminated by a second terminal and/or a second generator is coupled to the second terminal.

11. The method of claim 10, wherein the first terminal is coupled to the first generator and/or the second generator is coupled to the second terminal, and wherein the first generator and/or the second generator comprises and/or is-a synchronous generator or an asynchronous generator.

12. The method according claim 11, wherein the first generator and/or the second generator comprises a renewable power plant.

13. The method according claim 12, wherein the renewable power plant is an inverter-based resource (IBR).

14. The method according to claim 1, wherein computing the apparent impedance of the transmission line relay is performed by at least one of a relay, a controller, a server, or a cloud.

15. A device for distance protection of a transmission line carrying a plurality of phases for a phase-to-phase-to-ground fault comprising a first phase and a second phase of the plurality of phases as faulted phases in the phase-to-phase-to-ground fault, wherein the first phase is different from the second phase, the device comprising a processor being configured to:

obtain a first impedance of a first electrical loop formed by the first phase carried on the transmission line and a ground potential based on a zero-sequence current;

obtain a second impedance of a second electrical loop formed by the second phase carried on the transmission line and a ground potential based on the zero-sequence current;

compute an apparent impedance of the transmission line seen at a first terminal coupled to a first generator based on the first impedance and the second impedance; and perform the distance protection based on the apparent impedance.

16. The device according to claim 15, wherein computing the apparent impedance comprises computing a mean of the first impedance and the second impedance.

17. A system for distance protection of a transmission line carrying a plurality of phases comprising:

a transmission line; and the device according to claim 15.

18. The system according to claim 17, wherein computing the apparent impedance comprises computing a mean of the first impedance and the second impedance.

19. A non-transitory computer-readable medium having instructions stored thereon for a distance protection of a transmission line carrying a plurality of phases for a phase-to-phase-to-ground fault comprising a first phase and a second phase of the plurality of phases as faulted phases in the phase-to-phase-to-ground fault, wherein the first phase is different from the second phase, wherein the instructions, when executed by a processor, cause the processor to:

obtain a first impedance of a first electrical loop formed by the first phase carried on the transmission line and a ground potential based on a zero-sequence current;

obtain a second impedance of a second electrical loop formed by the second phase carried on the transmission line and a ground potential based on the zero-sequence current;

compute an apparent impedance of the transmission line seen at a first terminal based on the first impedance and the second impedance; and perform the distance protection based on the apparent impedance.

20. The non-transitory computer-readable medium according to claim 19, wherein computing the apparent impedance comprises computing a mean of the first impedance and the second impedance.

* * * * *